United States Patent
Refai-Ahmed et al.

(10) Patent No.: US 11,246,211 B1
(45) Date of Patent: Feb. 8, 2022

(54) MICRO DEVICE WITH THROUGH PCB COOLING

(71) Applicant: XILINX, INC., San Jose, CA (US)

(72) Inventors: Gamal Refai-Ahmed, Santa Clara, CA (US); Nagadeven Karunakaran, Singapore (SG); Hoa Do, San Jose, CA (US); Suresh Ramalingam, Fremont, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 17/188,795

(22) Filed: Mar. 1, 2021

(51) Int. Cl.
*H05K 1/02* (2006.01)
(52) U.S. Cl.
CPC ......... *H05K 1/0272* (2013.01); *H05K 1/0209* (2013.01)
(58) Field of Classification Search
CPC .................. H05K 1/0201–021; H05K 1/0272
See application file for complete search history.

(56) References Cited

U.S. PATENT DOCUMENTS

| | | |
|---|---|---|
| 9,812,374 B1 | 11/2017 | Refai-Ahmed et al. |
| 10,043,730 B2 | 8/2018 | Refai-Ahmed et al. |
| 10,147,664 B2 | 12/2018 | Refai-Ahmed et al. |
| 10,262,920 B1 | 4/2019 | Refai-Ahmed et al. |
| 10,529,645 B2 | 1/2020 | Gandhi et al. |
| 10,629,512 B2 | 4/2020 | Pan et al. |
| 10,720,377 B2 | 7/2020 | Refai-Ahmed et al. |
| 2020/0105642 A1 | 4/2020 | Gandhi et al. |
| 2021/0193620 A1 | 6/2021 | Refai-Ahmed et al. |

OTHER PUBLICATIONS

U.S. Appl. No. 16/786,447, filed Feb. 10, 2020 Entitled "Stacked Silicon Package Assembly Having Thermal Management".
U.S. Appl. No. 16/780,305, filed Feb. 3, 2020 Entitled "Thermal Heat Spreader Plate for Electronic Device".
U.S. Appl. No. 16/808,023, filed Mar. 3, 2020 Entitled "Three-Dimensional Thermal Management Apparatuses for Electronic Devices".

*Primary Examiner* — Jeremy C Norris
(74) *Attorney, Agent, or Firm* — Patterson + Sheridan, LLP

(57) ABSTRACT

Micro devices having enhanced through printed circuit board (PCB) heat transfer are provided. In one example, a micro device is provided that includes a PCB, a thermal management device, a chip package, a bracket, and a plurality of extra-package heat conductors. The chip package has a first side facing the thermal management device and a second side mounted to a first side of the PCB. The bracket is disposed on a second side of the PCB that faces away from the chip package. The plurality of extra-package heat conductors are disposed laterally outward of the chip package and provide at least a portion of a thermally conductive heat transfer path between the bracket and the thermal management device through the PCB.

20 Claims, 11 Drawing Sheets

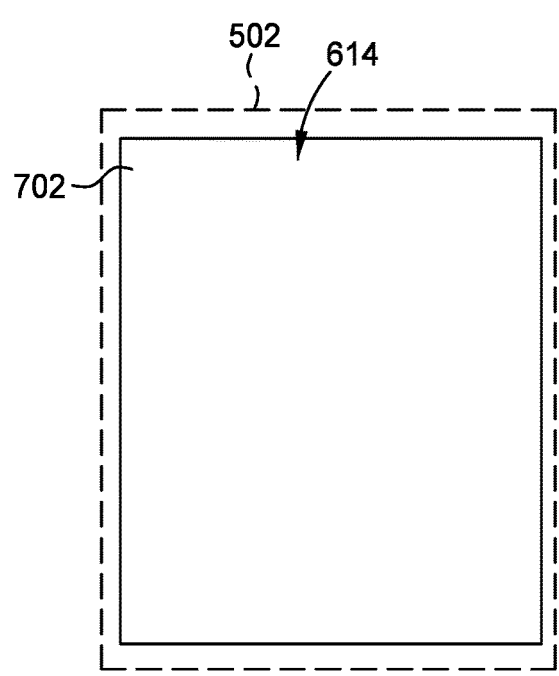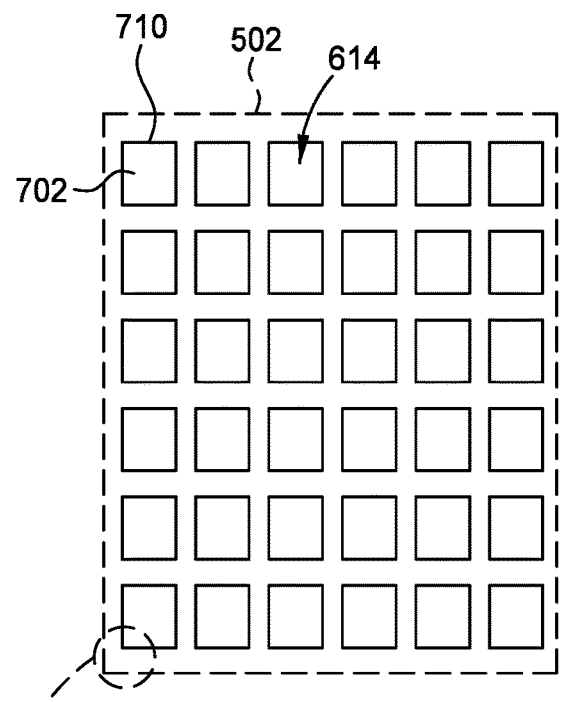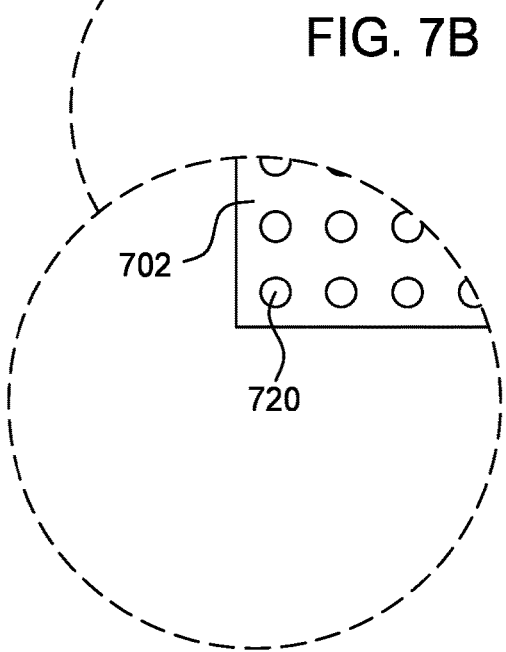
FIG. 7A
FIG. 7B

MICRO DEVICE WITH THROUGH PCB COOLING

TECHNICAL FIELD

Embodiments of the present invention generally relate to micro devices, such as electronic devices, photonic devices, microelectromechanical systems (MEMS) and/or RF devices, having multiple cooling paths routed through a printed circuit board (PCB) thermal management device.

BACKGROUND

Micro devices, such as electronic devices, photonic devices, microelectromechanical systems (MEMS) and/or RF devices, often employ electronic components which leverage chip package assemblies for increased functionality and higher component density. Conventional chip packaging schemes often utilize a package substrate, often in conjunction with a through-silicon-via (TSV) interposer, to enable a plurality of integrated circuit (IC) dies to be mounted to a single package substrate. The IC dies may include memory, logic or other IC devices. These micro devices containing one or more chip packages are frequently utilized in advanced electronic computing systems, such as found in telecomm and datacomm equipment, cellular antennas, data centers and automotive electronics, among others.

In many chip package assemblies, providing adequate thermal management has become increasingly challenging. Failure to provide adequate cooling often results in diminished service life and even device failure. Thermal management is particularly problematic in applications where active components have high current and power usage, and correspondingly generate high heat loads. Where active components are mounted close to package substrates, it is challenging to route heat out of the chip package, especially since the area below the package must be preserved to accommodate the solder balls needed to provide power, ground and communication lines between the chip package and the printed circuit board.

Therefore, a need exists for a micro device having improved thermal management.

SUMMARY

Micro devices, such as electronic devices, photonic devices, microelectromechanical systems (MEMS) and/or RF devices, having enhanced through printed circuit board (PCB) heat transfer are provided. In one example, a micro device is provided that includes a PCB, a thermal management device, a chip package, a bracket, and a plurality of extra-package heat conductors. The chip package has a first side facing the thermal management device and a second side mounted to a first side of the PCB. The bracket is disposed on a second side of the PCB that faces away from the chip package. The plurality of extra-package heat conductors are disposed laterally outward of the chip package and provide at least a portion of a thermally conductive heat transfer path between the bracket and the thermal management device through the PCB.

In another example, a micro device is provided that includes a PCB, a thermal management device, a chip package, a bracket, a heat generating device, and a plurality of extra-package heat conductors. The thermal management device includes at least one of an active cooling device and a passive cooling device. The active cooling device has an inlet port, internal channels and an outlet port configured to flow a heat transfer fluid therethrough. The heat generating device is disposed between the bracket and the PCB. The plurality of extra-package heat conductors are disposed laterally outward of the chip package and provide at least a portion of a thermally conductive heat transfer path between the bracket and the thermal management device through the PCB.

In yet another example, a micro device is provided that includes a PCB, a thermal management device, a chip package, a bracket, a heat generating device, and a first plurality of extra-package heat conductors. The chip package includes a first side facing the thermal management device and a second side mounted to a first side of the PCB. The bracket is disposed on a second side of the PCB that faces away from the chip package. The heat generating device is disposed between the bracket and the PCB. The first plurality of extra-package heat conductors are disposed laterally outward of the chip package and surface mounted to the PCB. The first plurality of extra-package heat conductors provide at least a portion of a thermally conductive heat transfer path between the bracket and the thermal management device through the PCB.

In still another example, the micro device described above further includes a second plurality of extra-package heat conductors disposed laterally outward of the chip package. The second plurality of extra-package heat conductors contact at least one of the bracket and the thermal management device. Each of the second plurality of extra-package heat conductors are respectively aligned across the PCB with a respective one of the first plurality of extra-package heat conductors.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 7A is a top view of a contact pad formed on a printed circuit board.

FIG. 7B is a top view of another example of a contact pad formed on a printed circuit board.

Figure 1:
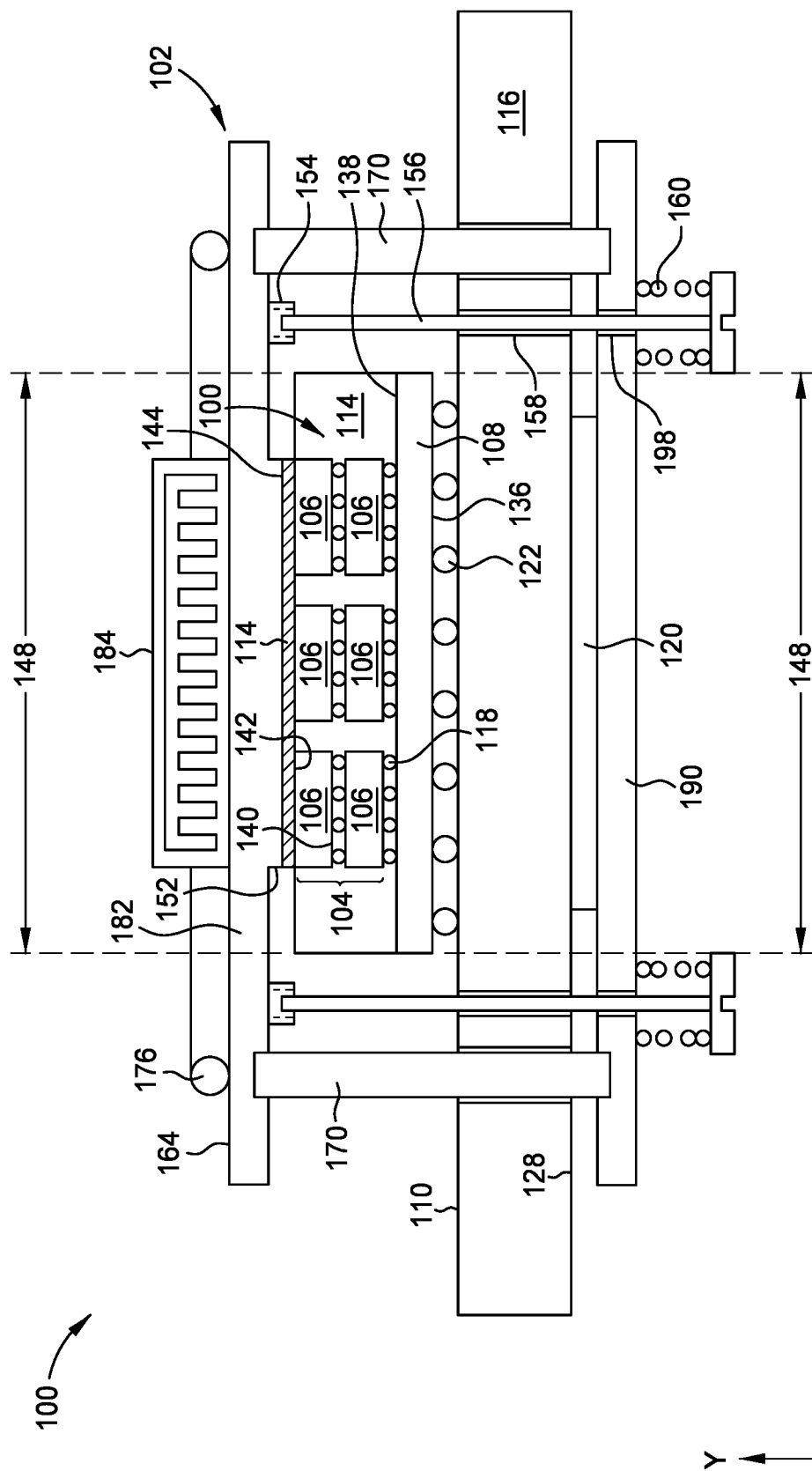
FIG. 1 is a schematic sectional view of a micro device having a chip package interfaced with a thermal management device utilizing extra-package heat conductors.

To facilitate understanding, identical reference numerals have been used, where possible, to designate identical elements that are common to the figures. It is contemplated that elements of one embodiment may be beneficially incorporated in other embodiments. Additionally, the adjectives top and bottom are provided for ease of explanation, and may be utilized to desired surfaces that alternatively may have a vertical orientation.

DETAILED DESCRIPTION

Micro devices having enhanced through printed circuit board (PCB) heat transfer are provided. Example of micro devices include, without limitation, electronic devices, photonic devices, microelectromechanical systems (MEMS) and/or RF devices. The micro devices described herein utilize of extra-package heat conductors disposed laterally outward of a chip package to provide at least a portion of a thermally conductive heat transfer path through the PCB. Extra-package means outside of the chip package. The through PCB, extra-package heat transfer path allows heat to be removed from the bottom of the chip package and collected on the bottom of the PCB, and routed to a thermal management device disposed above the chip package without interfering with routings and electrical connections disposed directly below the chip package in the PCB. This is particularly advantageous for thermal management of high power devices that are located close to the PCB, where convention heat transfer out through the top of the chip package is inefficient or inadequate. Thus, the extra-package chip package heat conductors disposed laterally outward of the chip package to provide a vertical conductive heat transfer path between the bottom of the PCB and the thermal management device without interfering with the design or performance of the chip package, while enabling higher power usage and improved performance. Further, as the extra-package heat conductors are not below the chip package, routings within the PCB below the chip package are undisturbed, which provides better efficiency and performance in high powered micro devices.

Turning now to FIG. 1, a schematic partial sectional view of a micro device 150 having at least one chip package 100 mounted to a printed circuit board (PCB) 116. The micro device 150 additionally includes a thermal management device 102 coupled to a bracket 190 disposed directly below the chip package 100 on the opposite side of the PCB 116. The thermal management device 102 functions as the primary global-level heat spreader plate of the micro device 150. A heat spreader (not shown) may optionally be disposed between the thermal management device 102 and the chip package 100. The heat spreader, when present, functions as a local-level heat spreader relative to the function of the thermal management device 102. Optionally, the thermal management device 102 may function with as a heat spreader, with a second thermal management device 102 mounted thereover.

The thermal management device 102 and the bracket 190 are interfaced by a plurality of extra-package heat conductors 170. The extra-package heat conductors 170 function to provide a conductive heat transfer path disposed laterally outward of the chip package 100 between the bracket 190 underlying the PCB 116 and the thermal management device 102. Accordingly, the extra-package heat conductors 170 are fabricated from a conductive material, for example a metal such as aluminum, copper, titanium or stainless steel, among others. The extra-package heat conductors 170 are isolated from the circuitry of the micro device 150, and do not transmit power or data signals. Thus, heat generated by the chip package 100 and transferred through the underlying PCB 116 to the bracket 190 may be directed outward around the chip package 100 and to the thermal management device 102 via the extra-package heat conductors 170. Accordingly, the extra-package heat conductors 170 beneficially provide increased heat transfer away from the chip package 100, thereby improving the performance and reliability of the micro device 150.

Continuing to describe the components of the micro device 150, the at least one chip package 100 is mounted to the printed circuit board 116. Although only one chip package 100 is shown mounted to the printed circuit board 116 in FIG. 1, more than one chip package 100 may be mounted to the printed circuit board 116. For example, up to as many chip packages 100 as can fit on the printed circuit board 116 may be utilized. Additionally, although only one printed circuit board (PCB) 116 is shown interfaced with a single thermal management device 102 in FIG. 1, more than one printed circuit board 116 may be interfaced with the thermal management device 102. For example, up to as many printed circuit boards 116 as available area allows to interface the with the thermal management device 102 may be utilized.

The chip package 100 may be a monolithic package, a Chip-on-Wafer-on-Substrate (CoWoS) package, a multichip module, an Embedded Multi-die Interconnect Bridge (EMIB) high density package, an Integrated Fan-Out (InFO) wafer level package, or other suitable chip package configuration. The chip package 100 is configured as a silicon device, a MEMS device, a photonic device, or an RF device. The chip package 100 may optionally comprise two or more types of the aforementioned devices. For example, the chip package 100 may include one or more silicon devices and one or more MEMS devices, and optionally one or more photonic devices and/or one or more RF devices. In another example, the chip package 100 may include one or more silicon devices and one or more photonic devices, and optionally one or more MEMS devices and/or one or more RF devices. In another example, the chip package 100 may include one or more silicon devices and one or more RF device devices, and optionally one or more MEMS devices and/or one or more photonic devices. In yet another example, the chip package 100 may include one or more MEMS devices and one or more photonic devices, and optionally one or more silicon devices and/or one or more RF devices. In still another example, the chip package 100 may include one or more MEMS devices, one or more RF devices, and optionally one or more silicon devices and/or one or more photonic devices.

The illustrative chip package 100 also includes one or more integrated circuit (IC) dies 106 and a package substrate 108. In the example illustrated in FIG. 1, the one or more integrated circuit dies 106 are electrically and mechanically mounted to the package substrate 108. Optionally, the one or more integrated circuit dies 106 may be electrically and mechanically mounted to an interposer, with the interposer electrically and mechanically mounted to the package substrate 108. The package substrate 108 of the chip package 100 is mounted to the PCB 116 for form at least a portion of the micro device 150.

Although six IC dies 106 are shown in FIG. 1, the total number of IC dies may range from one to as many as can be fit within the chip package 100. In FIG. 1, the three die stacks 104 each having two IC dies 106 are shown. The dies 106 are stacked vertically in a direction perpendicular to the orientation of the package substrate 108. The die stacks 104 are laterally spaced apart in a horizontal plane (i.e., parallel to the orientation of the package substrate 108). Optionally, one or more of the IC dies 106 may not stacked with another IC die. The vertical and horizontal directions are illustrated using X and Y coordinates in FIG. 1 for convenience of description, but it is contemplated that the orientation of the micro device 150 may be rotated to have an orientation different than as shown in FIG. 1.

Examples of IC dies 106 that may be utilized in the chip package 100 include, but are not limited to, logic and memory devices, such as field programmable gate arrays (FPGA), application-specific integrated circuits (ASICs), memory devices, such as high band-width memory (HBM), optical devices, processors or other IC logic or memory structures. One or more of the IC dies 106 may optionally include optical devices such as photo-detectors, lasers, optical sources, and the like.

Each IC die 106 includes a bottom surface 140 disposed opposite a top surface 142. The bottom and top surfaces 140, 142 do not necessarily represent the active and substrate sides of the dies 106. Although not shown, one or more IC dies 106 may be stacked on top of each other, with the bottom most die 106 being mounted to the package substrate 108. In one example of a die stack 104 disposed on the package substrate 108, the bottom surface 140 of one IC die 106 mounted to the top surface 142 of a second IC die 106 may result in the active sides of each die 106 facing the same direction, or facing opposite directions. For example, the active side of one IC die 106 may be directly mounted to the active side of the adjacent die 106.

Dielectric filler 112 is disposed on the package substrate 108 and at least partially laterally circumscribes the dies 106. The dielectric filler 112 may also encapsulate the dies 106 against the package substrate 108. The dielectric filler 112 provides additional rigidity to the chip package 100, while also protecting the solder connections 118 between the IC dies 106. The dielectric filler 112 may be an epoxy-based material or other suitable material. The dielectric filler 112 may additionally include fillers, for example, inorganic fillers such as silica ($SiO_2$).

In one example, the dielectric filler 112, prior to curing, has a viscosity suitable to flow into and fill the interstitial space between the bottom surface 140 of the dies 106 and the top surface 138 of the package substrate 108 around the solder connections 118. Alternatively, a separate underfill material may be used to fill the interstitial space the bottom surface 140 of the dies 106 and the top surface 138 of the package substrate 108 around the solder connections 118, while the dielectric filler 112 is disposed over the underfill and fills the interstitial space between adjacent dies 106.

Functional circuitry of the IC dies 106 is connected to the circuitry of the package substrate 108 through the solder connections 118 or other suitable electrical connection, such as a hybrid connecter comprised of metal circuit connection material disposed in a dielectric sheet. In the example depicted in FIG. 1, a bottom surface 136 of the package substrate 108 is electrically and mechanically coupled to the circuitry of the PCB 116 via solder balls 122 when the chip package 100 is mounted to an upper surface 110 of the PCB 116 to form the micro device 150.

The top surface 142 of the upper most die 106 faces a bottom surface 144 of a cooling plate 182 of the thermal management device 102. Optionally, a heat spreader may be disposed between the top surface 142 of the upper most die 106 and the thermal management device 102. The cooling plate 182 is fabricated from rigid thermally conductive material, such as stainless steel, copper, nickel-plated copper and aluminum, among other suitable thermally conductive materials. The heat spreader, when present, is fabricated from the same or similar materials. The heat spreader enhances local-level heat transfer to the cooling plate 182 of the thermal management device 102.

Thermal interface material (TIM) 114 may be disposed between the top surface 142 of the IC die 106 and the bottom surface 144 of the cooling plate 182 to enhance heat transfer therebetween. In one example, the TIM 114 may be a thermally conductive grease, thermal gel or thermal epoxy, such as, packaging component attach adhesives. Optionally, the TIM 114 may a plurality of thermally conductive particles dispersed in a carrier material. The carrier material may be comprised of the thermally conductive grease, thermal gel or thermal epoxy. The thermally conductive particles may include one or more of metal, carbon or other highly thermally conductive particles, metal fibers, metal powder, metal balls, fillers or additives that enhance the heat transfer of the carrier material of the TIM 114.

Optionally, the bottom surface 144 of the cooling plate 182 may include a patterned surface. The patterned surface may be comprised of dimples, projections, blind holes, slots, channels and the like which increase the surface area of the bottom surface 144 in contact with the TIM 114, which increases the heat transfer efficiency. The patterned surface, in one example, is comprised of a pattern of micro-grooves formed in the bottom surface 144 of the cooling plate 182. The patterned surface may be formed in the bottom surface 144 via etching, embossing, or any other suitable technique. For some examples, the patterned surface may be in the form of micro-grooves arranged rows, in columns, as positive-sloping diagonals, as negative-sloping diagonals, or as a combination thereof. In one example, the features (i.e., micro-grooves, protrusions, etc.) forming the patterned surface may have a plus or minus elevation of, but not limited to, 0.1 mm to 0.2 mm relative to the general plane of the bottom surface 144.

The thermally conductive particles, when utilized, may be up to and even greater than 90% of the TIM 114 by weight. The thermally conductive particles may have a particle size of up to about 25 μm. The thermally conductive particles, particularly when utilized in concert with the patterned surface, significantly increases the heat transfer efficiency between the thermal management device 102 and IC dies 106.

The thermal management device 102 may be structurally coupled to the package substrate 108 or PCB 116 to increase the rigidity of the chip package 100. Optionally, the thermal management device 102 may be dynamically mounted to the PCB 116 in a manner that allows relative movement between the thermal management device 102 to the underlying chip package 100. Allowing relative movement reduces stress within the chip package 100, which in turn increases the reliability and effectiveness of the solder connections 118.

In the example depicted in FIG. 1, the bottom surface 144 of the cooling plate 182 includes a threaded boss 154. The threaded boss 154 accepts a fastener 156 that extends through a through-hole 158 formed in the PCB 116 and a through-hole 198 formed through a bracket 190. The bracket 190 is disposed on a bottom surface 128 of the PCB 116 that faces away from the chip package 100. A spring 160 is disposed between the bottom surface 128 of the PCB 116 and the bracket 190. The spring 160 applies a force on the bracket 190 that is aligned in an axial direction of the fastener 156, which in turn causes the thermal management device 102 to be pulled toward the PCB 116 and bracket 190. The fastener 156 may be tightened to increase the force applied by the spring 190. The force on the thermal management device 102 also causes the thermal management device 102 to be urged against the IC dies 106 of the chip package 100, which is sandwiched between the thermal management device 102 and the upper surface 110 of the PCB 116. The bottom surface 144 of the cooling plate 182 may also include a pad 152 projecting from the bottom surface 144 that makes contact with the IC dies 106 through the TIM 114. Although shown as being planar, the pad 152 may include steps so that different portions of the pad 152 extend different distances from the bottom surface 144 of the cooling plate 182, thus allowing different heights of the IC dies 106 to be accommodated while maintaining good thermal contact with the thermal management device 102.

The bracket 190 is fabricated from a thermally conductive material. For example, the bracket 190 may be fabricated from a metal, such as aluminum, copper, titanium, or stainless steel, among others. The bracket 190 is disposed directly under and is generally wider than the chip package 100. Optionally, a gap-filling thermal pad 120 may be disposed between the bracket 190 and the PCB 116. The thermal pad 120 generally has a thermal conductivity of at least 1.0 W/mK. In one example, the thermal pad is a filled silicone elastomer. The larger than chip package size of the bracket 190 allows the bracket 190 to sink heat conducting through the PCB 116 from the chip package 100, and conduct the bottom-sinked heat laterally out from under the chip package 100 to the plurality of extra-package heat conductors 170. As the extra-package heat conductors 170 are located beyond the lateral extents 148 of the chip package 100, the extra-package heat conductors 170 have a clear route outward of the chip package 100 to conduct the bottom-sinked heat to the thermal management device 102.

The thermal management device 102 is disposed directly above the chip package 100. The cooling plate 182 of the thermal management device 102 is in good thermal contact directly with or through TIM 114 (and optional heat spreader) with the top surface 142 of the upper most die 106. The thermal management device 102 provides an efficient heat transfer path to sink heat away from the upper most die 106 of the one or more chip packages 100. Thus, the thermal management device 102 accepts both top- and bottom-sinked heat from the IC dies 106 of the chip package 100 through separate conductive heat transfer paths, enabling higher powered IC dies 106 and other devices to be used in the micro device 150 for more robust performance with enhanced reliability. The separate conductive heat transfer paths are later schematically illustrated in FIG. 10.

Figure 1A:
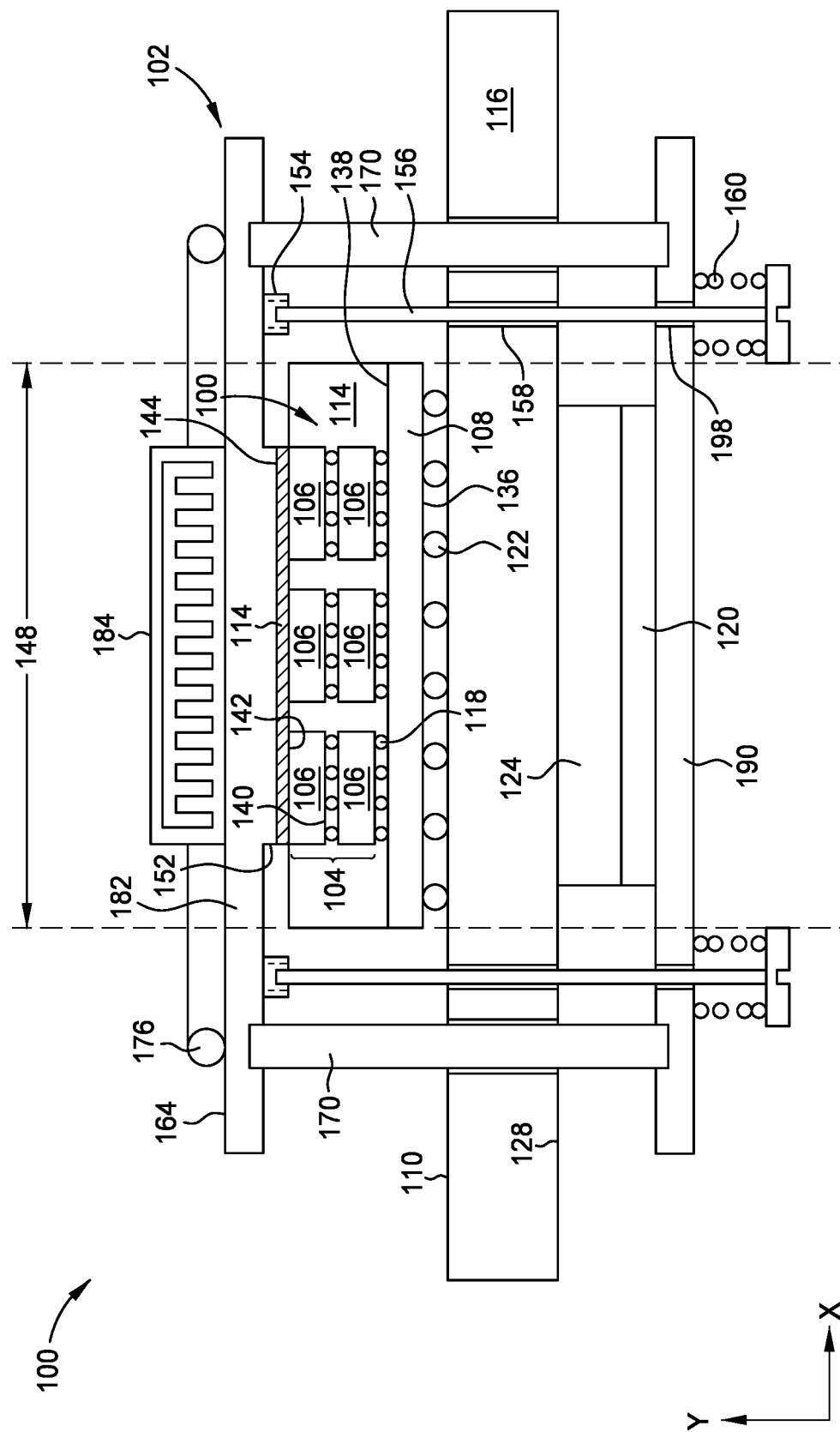
FIG. 1A is a schematic sectional view of another micro device having a chip package interfaced with a thermal management device utilizing extra-package heat conductors.

Optionally, a heat generating device 124 may be disposed between the PCB 116 and the bracket 190, as illustrated in FIG. 1A. When the heat generating device 124 is present, the gap-filling thermal pad 120 may be optionally disposed between the bracket 190 and the heat generating device 124 to enhance heat transfer therebetween. The heat generating device 124 can generally be any heat generating electrical or optical circuitry, either embodied in a chip, a chiplet a circuit element, or any combination thereof. When the heat generating device 124 is embodied in a circuit element, the heat generating device 124 may include at least one of a resistor, an inductor, and the like. When the heat generating device 124 is embodied in at least one of a chip or chiplet, the heat generating device 124 may be a power source, a power regulator, a processor, FPGA, photonic device, application-specific integrated circuit (ASIC), or other solid state device.

As the PCB 116 is an inefficient heat conductor, the bracket 190 provides an efficient heat conducting path from the heat generating device 124 to the thermal management device 102 through the extra-package heat conductors 170. Thus, the efficient heat transfer path to sink heat away from the heat generating device 124 allows placement of high powered devices and circuits below the PCB 116 in a location that conventional heat generating devices could only be placed at risk of overheating or loss of performance. Advantageously, the thermal management device 102 accepts both top-sinked heat from the IC dies 106 of the chip package 100 and bottom-sinked heat from the heat generating device 124 through separate conductive heat transfer paths, enabling higher powered IC dies 106 and higher power heat generating device 124 to be used in the micro device 150 for more robust performance with enhanced reliability. As stated above, the separate conductive heat transfer paths are later schematically illustrated in FIG. 10.

Continuing to refer to FIG. 1, the thermal management device 102 generally includes one or more optional passive cooling devices 176, and one or more optional active cooling devices 184. Optionally, the active cooling devices 184 may be utilized with or without the passive cooling device 176. The passive and active cooling devices 176, 184 are coupled to the cooling plate 182 in a manner that promotes efficient heat transfer therebetween.

Figure 2:
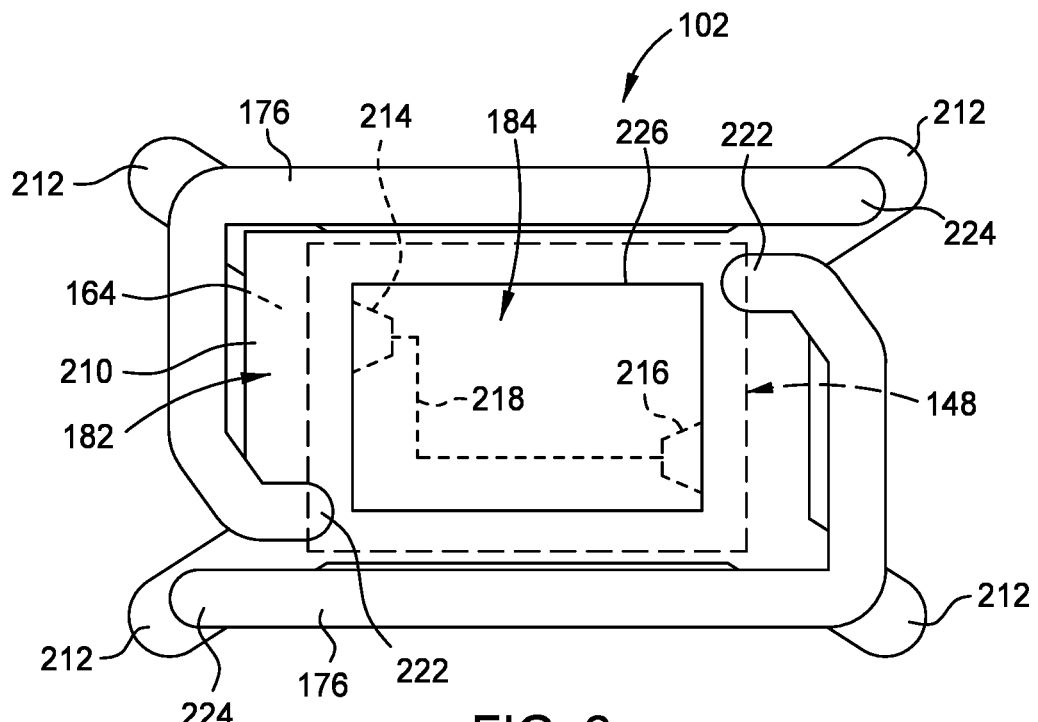
FIG. 2 is a schematic top view of the thermal management device of FIG. 1 illustrating an exemplary geometric arrangement of active and passive cooling devices disposed on a top surface of the thermal management device.

The cooling plate 182 has a top surface 164 that faces away from the bottom surface 162 and the chip package 100. The cooling plate 182 is fabricated from rigid thermally conductive material. Materials suitable for fabricating the cooling plate 182 include stainless steel, copper, nickel-plated copper and aluminum, among other suitable thermally conductive materials. In the example depicted in FIG. 1, the cooling plate 182 is fabricated from aluminum. Although the lateral planar area of the cooling plate 182 is not illustrated in FIG. 1, the planar area of the cooling plate 182 is larger, for example as much as 2, 4 or even 10 times or more larger than the planar area of the chip package 100. For example as illustrated in FIGS. 1 and 2, lateral extents 148 of the chip package 100 is much less than and is completely overlapped the lateral extents of the cooling plate 182. As a result, the area and mass of the cooling plate 182 is much, much greater than that of the chip package 100 and IC dies 106 disposed therein. Additionally, the lateral extents 148 of the chip package 100 is much less than and is completely overlapped the lateral extents of the bracket 190. This allows the extra-package heat conductors 170 to conductively transfer heat from the bottom of the chip package 100 to the cooling plate 182 outward of the lateral extents 148 of the chip package 100.

As mentioned above, the passive and active cooling devices 176, 184 are mounted in or on the top surface 164 of the cooling plate 182. For example, the one or more passive cooling devices 176 may be soldered, adhered, brazed, clamped, fastened or otherwise affixed in good thermal contact with the top surface 164 of the cooling plate 182. In one example, the one or more passive cooling devices 176 is affixed by a thermally conductive material 174 to the top surface 164 of the cooling plate 182. The thermally conductive material 174 may be solder, TIM or other suitable thermally conductive material.

The passive cooling device 176 generally is an object having a higher thermal conductivity than the cooling plate 182, and does not contain ports for working fluids such as coolant to be circulated therethrough. In one example, the passive cooling device 176 is a heat pipe. In another example, the passive cooling device 176 is a solid state or thermoelectric cooling device, such as a Peltier cooler, or other suitable cooling device. When in the form of a heat pipe, the passive cooling device 176 includes a sealed tube in which a phase change material is disposed. In operation, the phase change material in a liquid phase in contact with a thermally conductive solid surface, turns into a vapor by absorbing heat transferred from one of the IC dies 106. The vapor (e.g., the phase change material in a vapor phase) then travels within the heat pipe to the cold interface, and condenses back into a liquid —releasing the latent heat into the cooling plate 182 and/or active cooling device 184, as shown in FIG. 1, where the latent heat is eventually removed from the cooling plate 182 by the active cooling device 184. The phase change material in liquid form then returns to the hot interface at the first end of the heat pipe through capillary action and/or gravity, and the cycle repeats. Due to the very high heat transfer coefficients for boiling and condensation, the passive cooling device 176 in the form of a heat pipe is highly effective for conducting heat away from the dies 106 to locations of the cooling plate 182 from which the heat may be more quickly and effectively removed from the micro device 150, which advantageously improves the heat transfer performance of the IC dies 106 and chip packages 100 of the micro device 150.

The one or more active cooling devices 184 are mounted in or on the top surface 164 of the cooling plate 182. For example, the one or more active cooling devices 184 may be soldered, adhered, brazed, clamped, fastened or otherwise affixed in good thermal contact with the top surface 164 of the cooling plate 182. In one example, the one or more active cooling devices 184 is affixed by solder to the top surface 164 of the cooling plate 182.

The active cooling device 184 generally contain ports for circulating working fluids, such as coolant, through the active cooling devices 184. Thus, the passive cooling devices 176 generally route heat to different portions of the cooling plate 182, while the active cooling devices 184 removes heat from the cooling plate 182 and ultimately, the chip package 100 and micro device 150. Accordingly, the thermal management device 102 effectively removes heat from the chip packages 100 utilizing predetermined placement of the cooling devices 176, 184 relative to location of the heat sources (i.e., IC dies 106) within the chip packages 100 and extra-die heat transfer paths (i.e., the extra-package heat conductors 170).

FIG. 2 is a schematic top view of the thermal management device 102. As discussed above, the thermal management device 102 include the cooling plate 182 and the optional cooling devices 176, 184. The cooling plate 182 generally includes a body 202 and a plurality of tabs 204. The body 202 is disposed directly above the IC dies 106, as shown by the dashed line illustrating the lateral extents 148 of the chip package 100. The tabs 204 extend from the body 202 to distal ends 206. The distal ends 206 are laterally outward of the lateral extents 148 of the chip package 100.

As illustrated in FIG. 2, the active cooling device 184 generally includes a body 216 having a hollow interior through which passages 218 are routed between in inlet port 214 and an outlet port 216. The passages 218 may additionally include plurality of fins to increase the surface area for heat transfer. A heat transfer fluid is flowed through passages 218 to remove heat from the cooling plate 182.

In one example, the body 216 of the active cooling device 184 is coupled to the cooling plate 182 by brazing or other suitable technique. Although the body 216 may be located in other positions, in the example depicted in FIG. 2 the body 216 is located directly above the IC dies 106 of the chip package 100 as illustrated by the dashed line representing the lateral extents 148 of the chip package 100. The body 216 is fabricated from a highly thermally conductive material that is compatible with the heat transfer fluid. In one example, the body 216 are generally fabricated from copper.

The passive cooling device 176 is coupled to one or both of the body 210 or tabs 212 of the cooling plate 182. The passive cooling device 176 may additionally or alternatively be coupled to or be in contact with the active cooling device 184. In the example of FIG. 2, two passive cooling devices 176 are shown. However, one from to any respective number of passive cooling devices 176 may be interfaced with the cooling plate 182, as limited by spatial constraints. Additionally, one or more or all of the passive cooling devices 176 may be disposed on the same or different sides of the cooling plate 182.

The passive cooling devices 176 are generally positioned to move heat from one portion of the cooling plate 182 and distribute that heat to a portion of the cooling plate 182 closer to one of the active cooling devices 184. One or more of the passive cooling devices 176 may be a linear orientation, or have another orientation, such as U-shaped, L-shaped, J-shaped, "hockey stick-shaped" or other suitable shape.

Each of the passive cooling devices 176 may be elongated such that each passive cooling device 176 includes a first end 222 and a second end 224. The first end 222 is disposed in contact with the body 210 and/or the active cooling device 184. The second end 224 is disposed in contact with the tabs 212. In this manner, heat being transferred to the tabs 212 via the extra-package heat conductors 170 have two heat transfer paths to the active cooling device 184. The first path from the extra-package heat conductors 170 to the active cooling device 184 is conductively through the tabs 212 and body 210 of the cooling plate 182. The second path from the extra-package heat conductors 170 to the active cooling device 184 is conductively through the passive cooling device 176. As noted above, routing of the heat transfer paths is further illustrated in FIG. 10. Continuing to refer to FIG. 2, each passive cooling device 176 is interfaced with two tabs 212 prior to terminating at the body 210 and/or active cooling device 184. In another example, heat transfer from each tab 212 may be routed through a corresponding passive cooling device 176 in a one-to-one relationship. The utilization of multiple heat transfer paths (i.e., through and not through the passive cooling device 176) from each extra-package heat conductors 170 greatly increases the efficiency and amount of heat that can be removed from the bottom of the chip package 100 from below the PCB 116.

Figure 3:
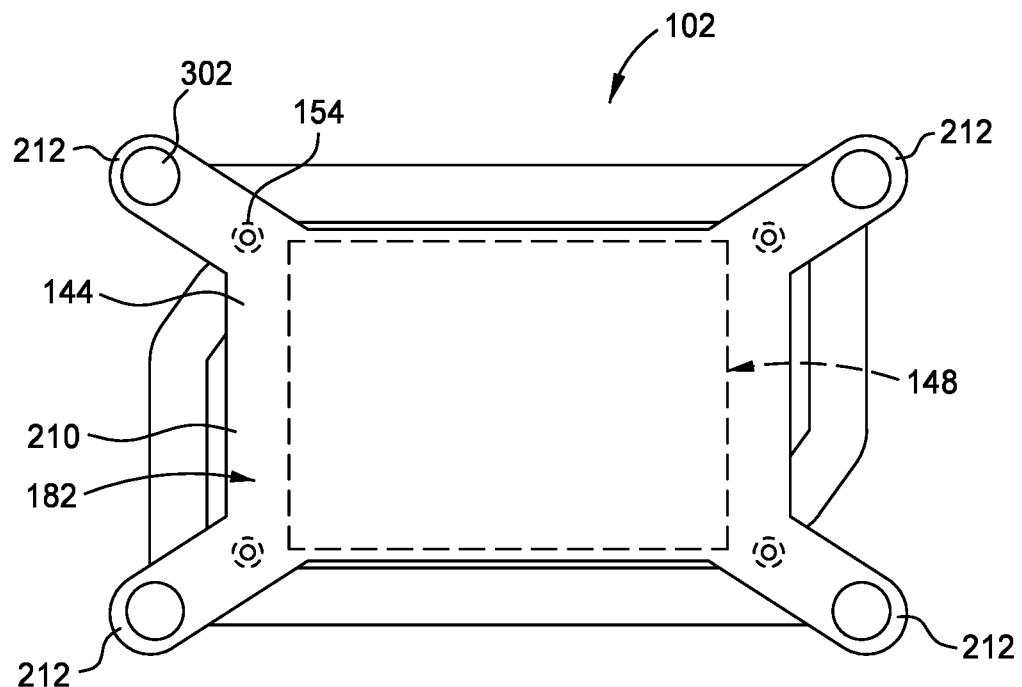
FIG. 3 is a schematic bottom view of the thermal management device of FIG. 2.

FIG. 3 is a schematic bottom view of the cooling plate 182 of the thermal management device 102 of FIG. 2. The threaded boss 154 is depicted on the bottom surface 144 of the cooling plate 182. The threaded boss 154 may be located on the tab 212 or the body 210 of the cooling plate 182. The threaded boss 154 may be an insert or surface mount female threaded nut. Alternatively, the threaded boss 154 may simply be a threaded hole in the cooling plate 182.

The bottom surface 144 of the cooling plate 182 may optionally include a recess 302 formed in the tab 212. The recess 302 may be located to either side of the threaded boss 154. In FIG. 3, the recesses 302 are deposed in each tab 212 outward of the threaded boss 154 relative to a center of the cooling plate 182.

Figure 4:
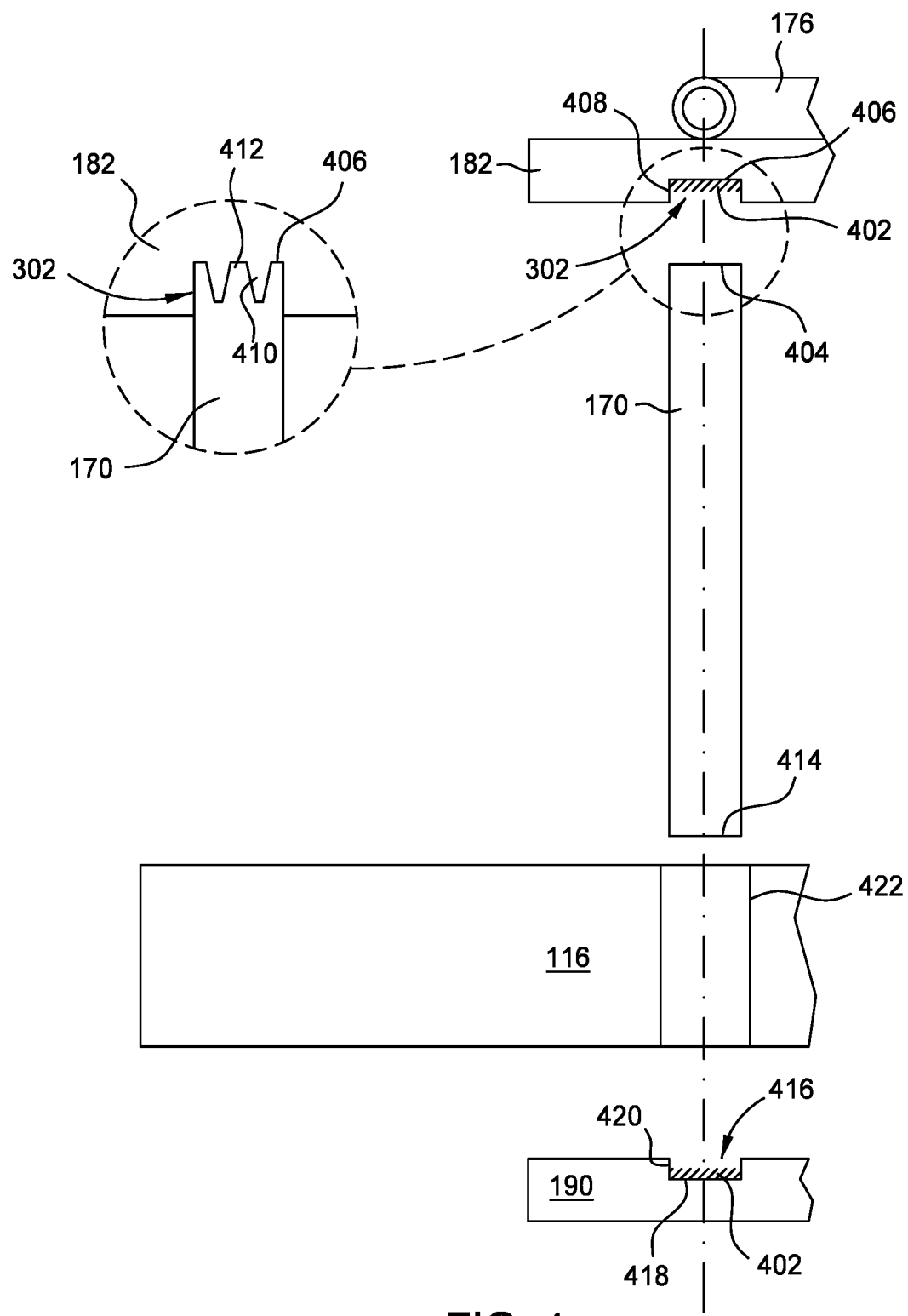
FIG. 4 is an enlarged exploded partial schematic sectional view of an interface between one of the extra-package heat conductors and the thermal management device of FIG. 2 through a printed circuit board.

Referring additionally to the exploded view of FIG. 4 depicting the interface between the cooling plate 182, the bracket 190, and one of the extra-package heat conductors 170, the recess 302 is sized to receive a first end 404 of the extra-package heat conductor 170. TIM 402 may be utilized between the first end 404 of the extra-package heat conductor 170 and a bottom 406 and/or sidewalls 408 of the recess 302 to enhance heat transfer. In one example, one or both of the first end 404 of the extra-package heat conductor 170 and the bottom 406 of the recess 302 may include surface area enhancing features (SAEF) to increase the available area for heat transfer between the extra-package heat conductor 170 and the tab 212 of the cooling plate 182. The SAEF may be comprised of dimples, projections, blind holes, slots, channels and the like which increase the surface area of the bottom 406 and the end 404 in contact with the TIM 402, which increases the heat transfer efficiency.

The SAEF, in one example, is comprised of a pattern of micro-grooves formed in the bottom 406 of the cooling plate 182 and the end 404 of the extra-package heat conductor 170. The micro-grooves generally have a width that is very small such that the total area of the micro-grooves (i.e., the total length of the micro-grooves multiplied the width) is much less, such as at least 90% less, than an area of the bottom 406 of the cooling plate 182 and the end 404 of the extra-package heat conductor 170 that has no micro-grooves. The micro-grooves may be formed via etching or any other suitable method. The SAEF may be formed by etching, embossing, or any other suitable technique. For some examples, the SAEF may be in the form of micro-grooves arranged rows, in columns, as positive-sloping diagonals, as negative-sloping diagonals, or as a combination thereof. In one example, the features (i.e., micro-grooves, protrusions, etc.) forming the patterned surface may have a plus or minus elevation of, but not limited to, 0.1 mm to 0.2 mm relative to the general plane of the bottom surface 144 of the cooling plate 182.

In another example, the SAEF may be in the form of mating protections 410, 412 that interleave to increase the contact area between the bottom 406 of the cooling plate 182 and the end 404 of the extra-package heat conductor 170, illustrated as assembled in the dashed bubble of FIG. 4.

Also as illustrated in the exploded view of FIG. 4, the extra-package heat conductor 170 extends through a through-hole 422 in the PCB 116 such that a second end 414 of the extra-package heat conductor 170 can contact the bracket 190. Similar to the cooling plate 182, the bracket 190 includes a recess 416 is sized to receive the second end 414 of the extra-package heat conductor 170. TIM 402 may also be utilized between the second end 414 of the extra-package heat conductor 170 and a bottom 418 and/or sidewalls 420 of the recess 416 to enhance heat transfer. As with the first end 404 of the extra-package heat conductor 170 and the bottom 406 of the recess 302 described above, the second end 414 of the extra-package heat conductor 170 and the bottom 418 of the recess 416 may also include surface area enhancing features (SAEF).

When assembled, the extra-package heat conductors 170 may be retained in the recesses 302, 416 by the force exerted by the fasteners 156 retaining the bracket 190 to the thermal management device 102. Optionally, the extra-package heat conductors 170 may be retained in at least one or both of the recesses 302, 416 by adhesives, brazing, staking, force fit, pins, fasteners or other suitable technique.

Figure 5:
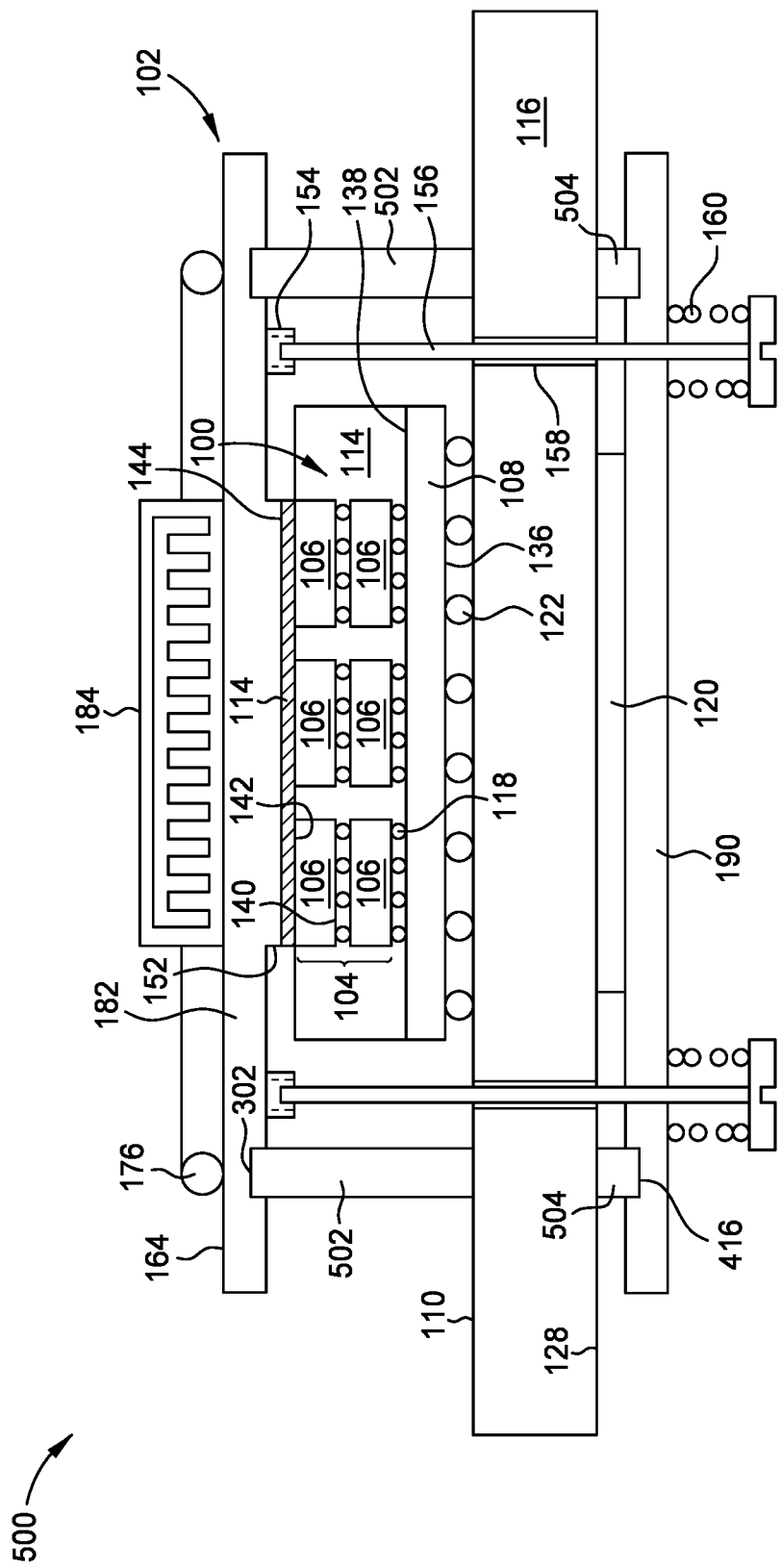
FIG. 5 is a schematic sectional view of another micro device having a chip package interfaced with a thermal management device utilizing extra-package heat conductors.

FIG. 5 is a schematic sectional view of another micro device 500 having a chip package 100 disposed on a PCB 116 and interfaced with a thermal management device 102. The chip package 100 and the thermal management device 102 of the micro device 500 are essentially identical to those present in the micro device 150 described above, except wherein extra-package heat conductors do not extend through the PCB 116, but rather a first plurality of extra-package heat conductors 502 are aligned with a second plurality extra-package heat conductors 170 to conduct heat from a bracket 190 disposed below the PCB 116 to the thermal management device 102. Each pair of aligned extra-package heat conductors 502, 504 essentially function as one of the extra-package heat conductors 170, transferring heat from the bottom of the chip package 100 through the PCB 116 to the thermal management device 102.

The other components of the micro device 500 are essentially identical to those present in the micro device 150 described above, and are identified in FIG. 5 by the same reference numerals utilized in FIG. 1. The extra-package heat conductors 502, 504 and the PCB 116 are constructed differently, and are further described below in FIG. 6

Figure 6:
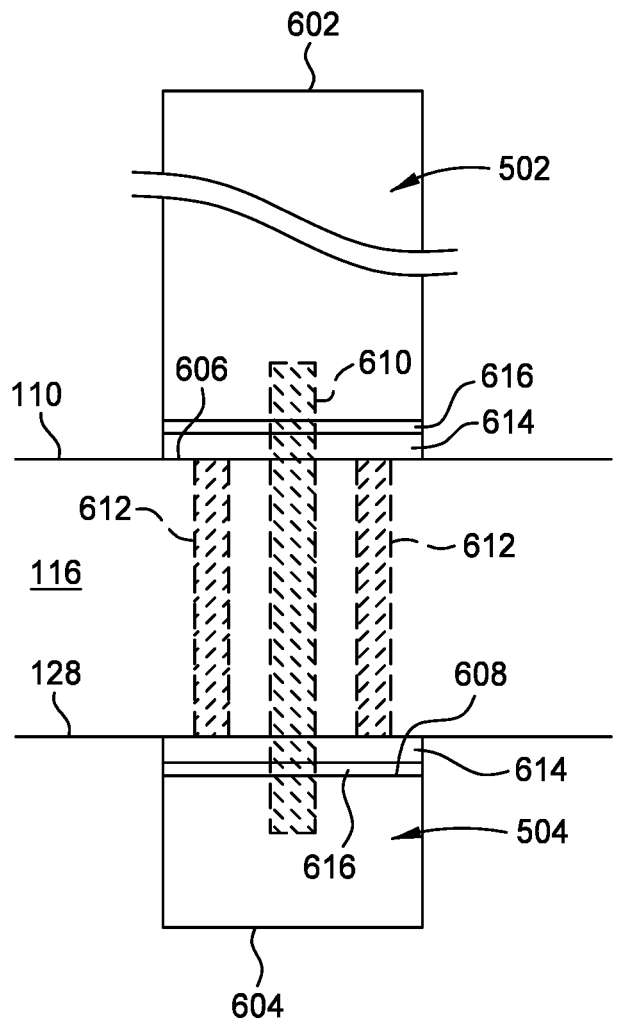
FIG. 6 is partial sectional view of the micro device of FIG. 5 illustrating examples of an interface between the extra-package heat conductors and a printed circuit board.

FIG. 6 is partial sectional view of the micro device 150 of FIG. 5 illustrating examples of an interface between an aligned pair of extra-package heat conductors 502, 504 and the PCB 116. In one example, at least one of the extra-package heat conductors 502, 504 is surface mounted to the PCB 116. The extra-package heat conductors 502, 504 may be surface mounted to the PCB 116 utilizing solder, adhesive or other suitable technique. Optionally, one or both of the extra-package heat conductors 502, 504 are secured to one or both of the bracket 190 and the cooling plate 182.

Figure 6A:
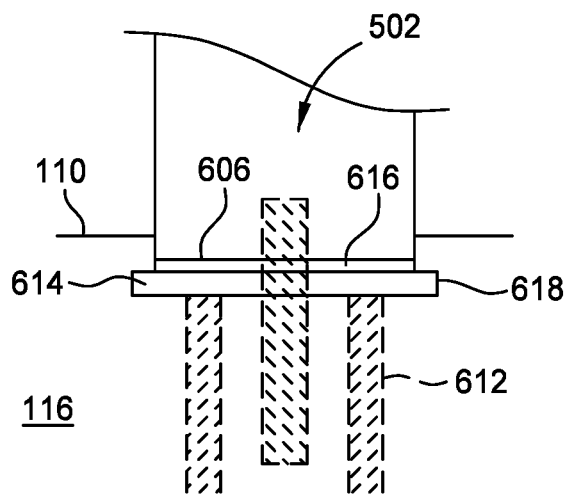
FIG. 6A is a partial sectional view of another example of an interface between the extra-package heat conductors and a printed circuit board.

In the example depicted in FIG. 6, the PCB includes contact pads 614 for coupling to the extra-package heat conductors 502, 504. The contact pads 614 may be fabricated from copper or other suitable good heat conducting material. The contact pads 614 may be a non-solder mask defined (NSMD) pad 614 as shown in FIG. 6, or a surface mount (SM) pad 614 as shown in FIG. 6A. A thermally conductive interface material 616 may be utilized between the extra-package heat conductors 502, 504 and the contact pads 614 to promote heat transfer and/or provide adhesion therebetween. The interface material 616 may be TIM, thermally conductive adhesive, braze compound, solder or other suitable material.

The aligned pair of extra-package heat conductors 502, 504 transfer heat from the bracket 190 to the cooling plate 182 across the PCB 116. In one example, the PCB 116 includes no features specifically designed to increase the efficiency of heat transfer between the first extra-package heat conductor 502 and the extra-package heat conductor 504 across the PCB 116.

In another example, the PCB 116 includes one or more thermally conductive vias 612 formed through the PCB 116. The conductive vias 612 may be aluminum, copper, solder or other heat conducting material that has a higher coefficient of heat transfer as compared to the PCB 116. The thermally conductive vias 612 are in contact with the extra-package heat conductors 502, 504 through the contact pads 614 and interface material 616.

In still another example, the PCB 116 includes an aperture through which a thermally conductive post 610 is disposed. The conductive post 610 is fabricated from be aluminum, copper, stainless steel or other good heat conductor. The conductive post 610 are in contact with the aligned extra-package heat conductors 502, 504. The conductive post 610 may be extend into a hole formed in second ends 606, 608 of the extra-package heat conductors 502, 504 disposed against the PCB 116. In one example, the conductive post 610 is slip or forced-fit into the ends 606, 608 of the extra-package heat conductors 502, 504. Solder, TIM or other suitable heat transfer enhancing material may also be utilized to enhance the heat transfer between the extra-package heat conductors 502, 504 and the conductive post 610. The conductive post 610 may optionally be utilized with one or more conductive vias 612.

The each of the first extra-package heat conductors 502 also includes a first end 602 that contacts the bottom surface 144 of the conductive plate 182. In one example, the first end 602 is received in a pocket (i.e., recess 302) formed in the conductive plate 182 as described above. The first end 602 and the bottom 406 of the recess 302 may include surface area enhancing features (SAEF) as described above with reference to FIG. 4.

Similarly, each of the second extra-package heat conductors 504 also includes a first end 604 that contacts the bracket 190. In one example, the first end 604 of the second extra-package heat conductor 504 is received in a recess 416 formed in the bracket 190 as described above. The first end 604 and the bottom 418 of the recess 302 may also include surface area enhancing features (SAEF) as described above with reference to FIG. 4.

The aligned pair of extra-package heat conductors 502, 504 provides an extra-package heat transfer path through the PCB 116 without having to provide large apertures in the PCB 116. Thus, electrical routing in the PCB 116 does not have to be specially designed or be disruptive to designs that optimize performance of the micro device 500.

Figure 5A:
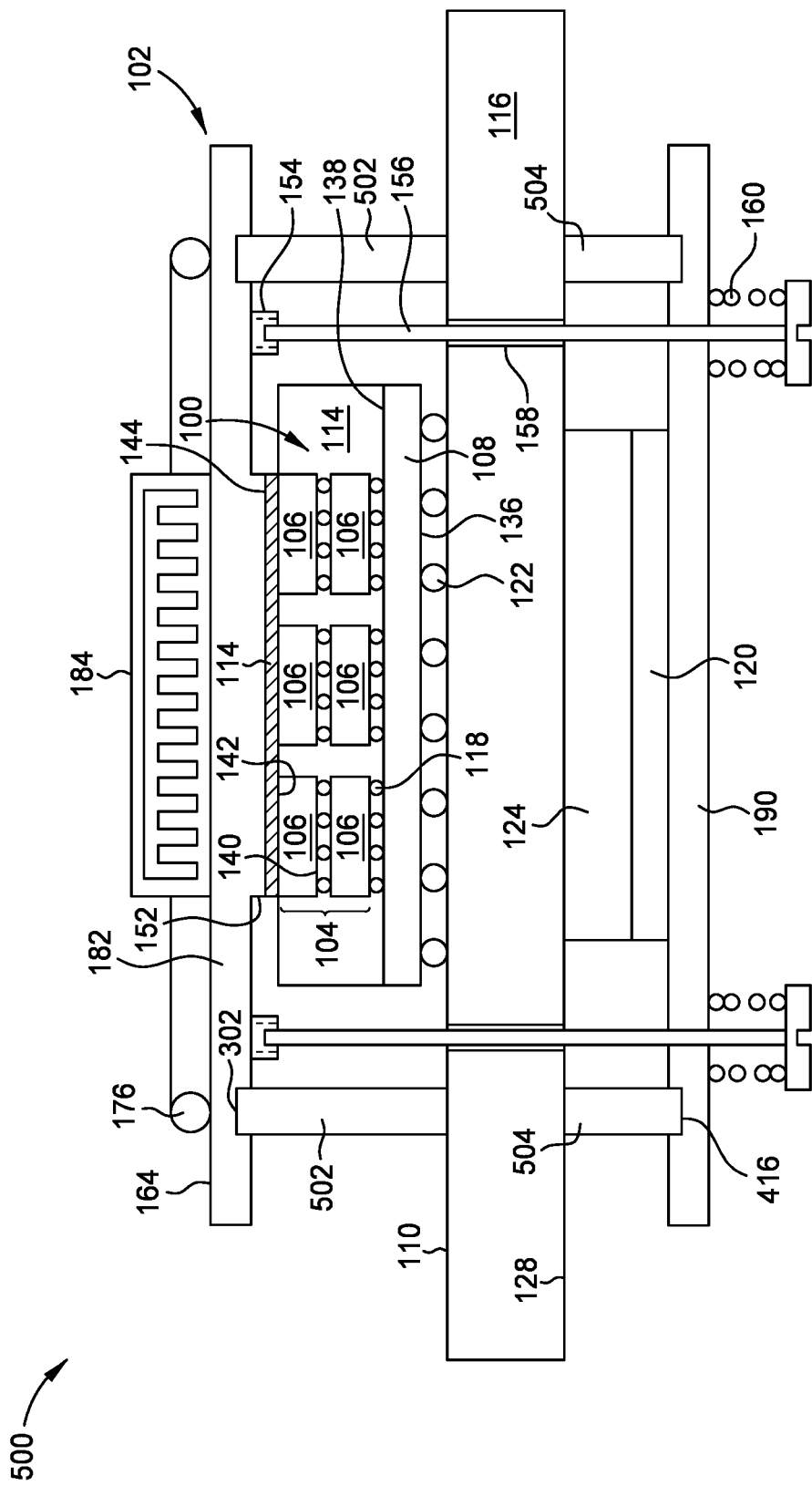
FIG. 5A is a schematic sectional view of another micro device having a chip package interfaced with a thermal management device utilizing extra-package heat conductors.

Similarly to the micro device 100 described above, the micro device 500 may optionally include a heat generating device 124 disposed between the PCB 116 and the bracket 190, as illustrated in FIG. 5A. As stated above, the bracket 190 provides an efficient heat conducting path from the heat generating device 124 to the thermal management device 102 through the extra-package heat conductors 502, 504. Thus, the efficient heat transfer path to sink heat away from the heat generating device 124 allows placement of high powered devices and circuits below the PCB 116 in a location that conventional heat generating devices could only be placed at risk of overheating or loss of performance. Advantageously, the thermal management device 102 accepts both top-sinked heat from the IC dies 106 of the chip package 100 and bottom-sinked heat from the heat generating device 124 through separate conductive heat transfer paths, enabling higher powered IC dies 106 and higher power heat generating device 124 to be used in the micro device 150 for more robust performance with enhanced reliability. As stated above, the separate conductive heat transfer paths are later schematically illustrated in FIG. 10.

Alternatively, one or both of an active or passive cooling device 176, 184 may be replace the heat generating device 124 in the micro device 500. In still other example, or one or both of an active or passive cooling device 176, 184 may be disposed in contact with, the heat generating device 124, the thermal contact pad 124 or the bracket 190.

FIG. 7A is a top view of the contact pad 614 formed on the printed circuit board 116. As illustrated in FIG. 7A, a top surface 702 of the contact pad 614 may be a contiguous sheet of material. The area of the top surface 702 of the contact pad 614 may be bigger, the same, or smaller than the area of the extra-package heat conductor 502 (shown in phantom in FIG. 7A). In one example, the top surface 702 of the contact pad 614 is between about 75 to 225 square millimeters. The interface material 616 may also be sized similar to the top surface 702, for example in a single sheet of material. The top surface 702 of the contact pad 614 may be similarly sized relative to the extra-package heat conductor 504 disposed on the opposite side of the PCB 116.

Alternatively, the top surface 702 of the contact pad 614 may be formed from two or more of discrete portions of material. For example, as illustrated in FIG. 7B, the top surface 702 of the contact pad 614 may be segmented into a plurality of discrete sub-pads 710. The interface material 616 may also be sized to in discrete portions on top of each sub-pad 710. In one example, the sub-pads 710 has a surface area of between about 160,000 to 250,000 square micrometers. The sub-pads 710 may have any suitable shape, such as circles, ovals, polygons or other shape. The sub-pads 710 may be randomly disposed, or arranged in an array, such as a grid of rows and column as shown in FIG. 7B.

The top surface 702 of the contact pad 614 on one or both sides of the PCB 116 may have include surface area enhancing features (SAEF) as described above with reference to FIG. 4. As noted above, SAEF may be formed on the top surface 702 of the contact pad 614, the ends 606, 608 of the extra-package heat conductors 502, 504, and/or the surfaces of the cooling plate 182 and/or bracket 190 that mate with the extra-package heat conductors 502, 504. SAEF formed in the contact pad 614 improves crack prevent at interface of contact pad 614 and the extra-package heat conductors 502, 504.

In the example depicted in FIG. 7B, SAEF are shown as recesses 720 formed on the surface of the top surface 702 of the contact pad 614. The recesses 720 may be micro-grooves, embossments, etched surfaces, bead or abrasive blasted surfaces, needle or pricked surfaces, holes or other type of 3D surface texturing. The recesses 720 may also be formed in the top surface 702 of the contact pad 614 shown in FIG. 7A.

Figure 8A:
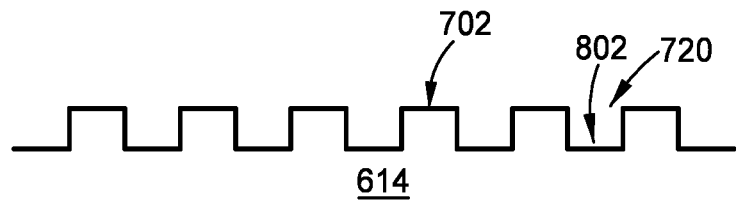
FIG. 8A is a partial sectional view of a top surface of a contact pad formed on a printed circuit board.

In the example depicted in the partial sectional view of the top surface 702 of the contact pad 614 depicted in FIG. 8A, the recesses 720 formed in the top surface 702 of the contact pad 614 is comprised of a pattern of micro-grooves 802. The micro-grooves 802 generally have a width that is very small such that the total area of the micro-grooves (i.e., the total length of the micro-grooves multiplied the width) is much less, such as at least 90% less, than an area of the top surface 702 of the contact pad 614 that has no micro-grooves. The micro-grooves 802 may be formed by etching, embossing, or any other suitable technique. For some examples, the micro-grooves 802 may be arranged rows, in columns, as positive-sloping diagonals, as negative-sloping diagonals, or as a combination thereof. In one example, the features (i.e., micro-grooves, protrusions, etc.) forming the patterned surface may have a plus or minus elevation of, but not limited to, 0.1 mm to 0.2 mm relative to the general plane of the top surface 702 of the contact pad 614. As noted above, the ends 606, 608 of the extra-package heat conductors 502, 504 may include micro-grooves 802 or other type of SAEF.

Figure 8B:
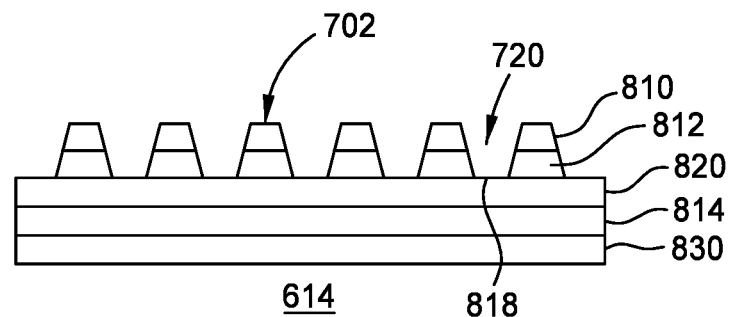
FIG. 8B is a partial sectional view of another example of a top surface of a contact pad formed on a printed circuit board.

FIG. 8B depicts another example of the top surface 702 of the contact pad 614 having recesses 720 formed therein. The recesses 720, which may be micro-grooves, blind holes, or other surface recess, is formed through a top metal layer 810 of the pad 614. The recesses 720 may extend through an adjacent underlying first dielectric layer 812 to expose a surface 818 of a second metal layer 820 of the pad 614. The second metal layer 820 may alternatively be part of the PCB 116. The second metal layer 820 is shown separated from a third metal layer 830 by a second dielectric layer 814. The third metal layer 820 may be part of the pad 114 or PCB 116.

In one example, the second metal layer 820 is part of metal layers forming the conductive routing of the PCB 116. The recesses 720 in the form of micro-vias or other type of blind hole allows the solder or other connecting material to firmly anchor the extra-package heat conductors 502, 504 and contact pad 614 to the conductive routing laminate (including the second metal layer 820) of the PCB 116.

Figure 8C:
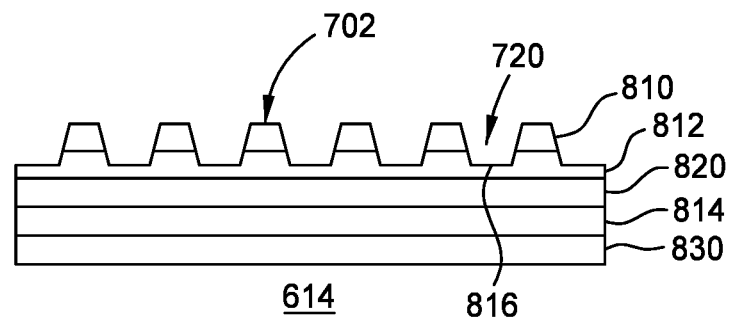
FIG. 8C is a partial sectional view of yet another example of a top surface of a contact pad formed on a printed circuit board.

FIG. 8C depicts another example of the top surface 702 of the contact pad 614 having recesses 720 formed therein. The recesses 720 are illustrated as blind holes or grooves formed through a top metal layer 810 of the pad 614 and partially through the underlying first dielectric layer 812 to expose a surface 818 of a second metal layer 820. In one example, the second metal layer 820 is part of metal layers forming the conductive routing of the PCB 116. The recesses 720 in the form of micro-groove or blind hole provides greater surface area for the solder or other connecting material to firmly anchor the extra-package heat conductors 502, 504 and contact pad 614 to the conductive routing laminate (including the second metal layer 820) of the PCB 116. In one example, the recesses 720 are mechanically formed, for example by drilling, embossing, or pricking the at least a portion of the first metal layer 810 and optionally a portion of the first dielectric layer 812 to a desired depth, such as about 25.4 µm. In another example, the recesses 720 are laser drilled through at least a portion of the first metal layer 810 and optionally a portion of the first dielectric layer 812 to a desired depth to a desired depth, such as about 101.6 µm.

Figure 9A:
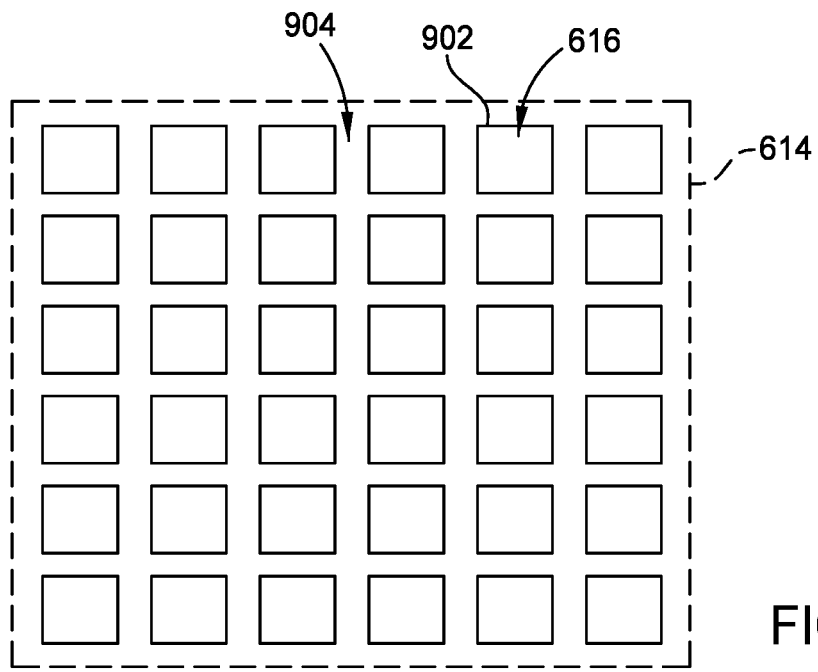
FIG. 9A is a top view of one example of an interface material that may be formed on a contact pad.

FIG. 9A is a top view of one example of the interface material 616 formed on the contact pad 614. As illustrated in FIG. 9A, the interface material 616 may be formed from two or more of discrete segments 902 of material. For example, as illustrated in FIG. 9A, the segments 902 of interface material 616 are separated by channels 904 that is free from interface material 616. The channels 904 may be arranged in horizontal row and vertical column such that the segments 902 of interface material 616 are arranged in an array of rectangles or squares. In one example, each segment 902 has a surface area of between about 160,000 to 250,000 square micrometers.

Figure 9B:
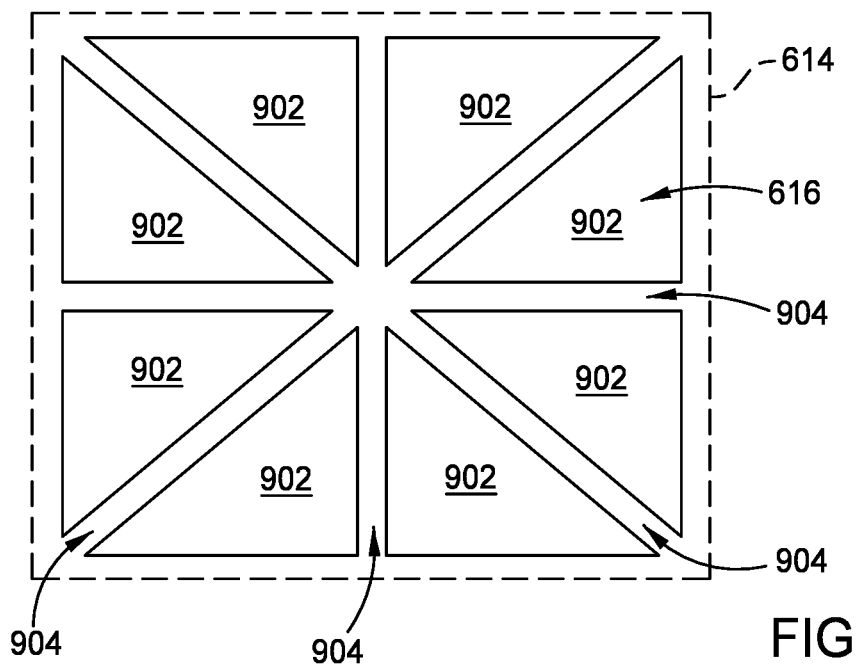
FIG. 9B is a top view of another example of an interface material that may be formed on a contact pad.

FIG. 9B of another example of the interface material 616 formed on the contact pad 614. As illustrated in FIG. 9B, the interface material 616 is formed from a plurality of discrete segments 902 of interface material 616. The segments 902 of interface material 616 are separated by a plurality of channels 904, at least two of which are oriented at acute angles. In the example depicted in FIG. 9B, the channels 904 are arranged such that at least three channels 904 intersect at the center of the contact pad 614. For example, three channels 904 intersect at their centers at the center of the contact pad 614 interface material 616 to form a polar array of segments 902. Each segment 902 may have a triangular shape. Other shapes may also be formed in other embodiments. In on example, each segment 902 has a surface area of between about 8 to 28 square millimeters.

Figure 10:
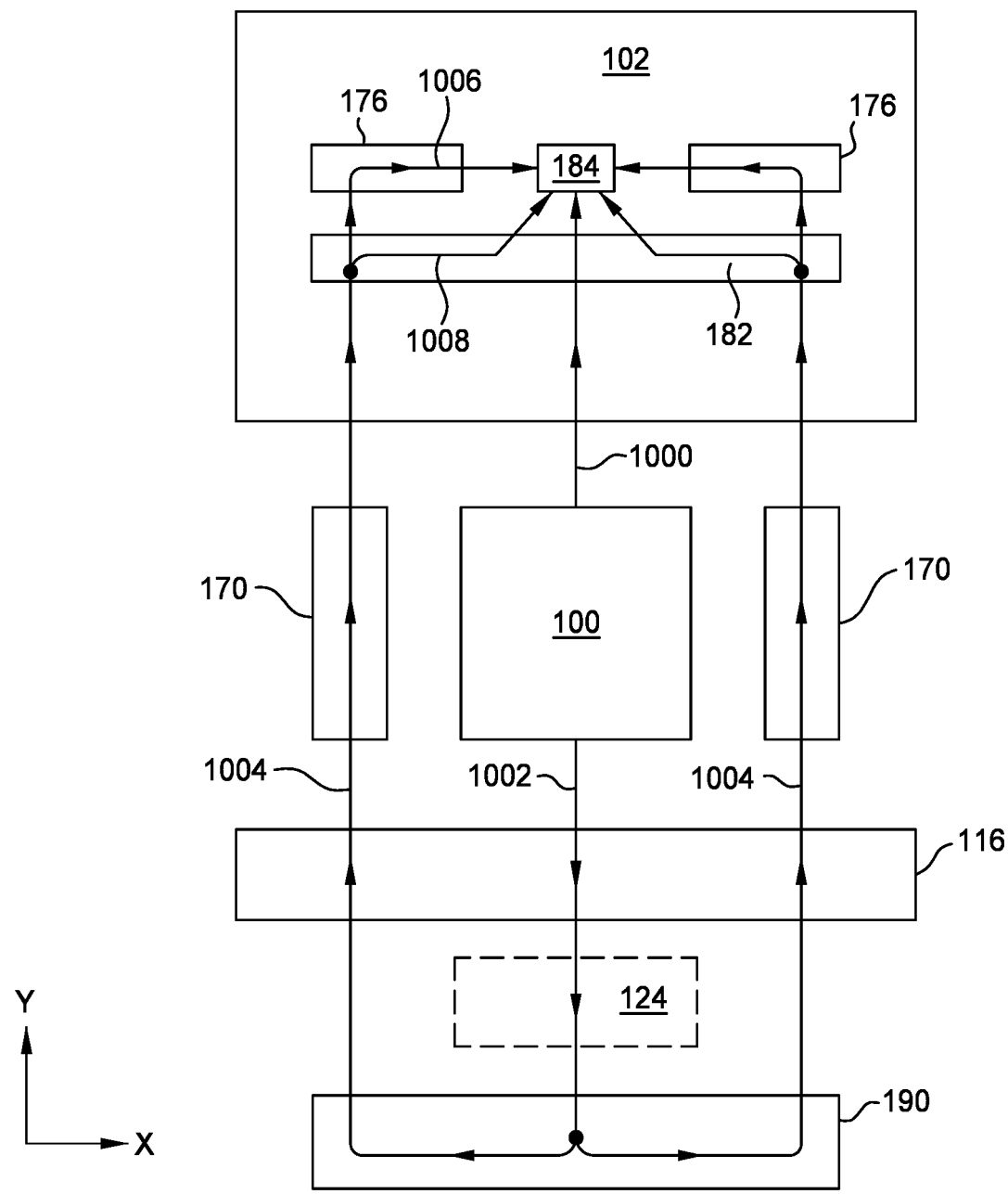
FIG. 10 is a schematic flow diagram of illustrating exemplary conductive heat transfer paths of the micro device of FIGS. 1 and 5, among others.

FIG. 10 is a schematic flow diagram of illustrating exemplary conductive heat transfer paths of the micro device 150 of FIG. 1. The flow diagram of FIG. 10 is also illustrate of the heat transfer paths of the micro device 500 of FIG. 5 among others. In the schematic flow diagram of FIG. 10, two primary conductive heat transfer paths originate at the chip package 100. In examples when a heat generating device 124 (shown in phantom in FIG. 10) is present below the PCB 116, one of the primary conductive heat transfer paths originates at the chip package 100, while the primary conductive heat transfer paths originates at the other heat generating device 124.

The first of the two primary conductive heat transfer paths that originates at the chip package 100 can be referred to as a top side heat transfer path 1000. The top side heat transfer path 1000 is illustrated in FIG. 10 exiting the top of the chip package 100. The top side heat transfer path 1000 transfers heat vertically upward (i.e., in the (+) Y direction) from the chip package 100 to the thermal management device 102. In the thermal management device 102, the top side heat transfer path 1000 transfer heat through the cooling plate 182 to the active cooling device 184. Generally, the top side heat transfer path 1000 has a predominantly vertically orientation.

The second of the two primary conductive heat transfer paths that originates at the chip package 100 or the heat generating device 124 can be referred to as a bottom side heat transfer path 1002. The bottom side heat transfer path 1002 is illustrated in FIG. 10 exiting the bottom of the chip package 100. The bottom side heat transfer path 1002 first transfers heat vertically downward (i.e., in the (−)Y direction) from the chip package 100 to the region of the PCB 116 directly below the chip package 100. The bottom side heat transfer path 1002 continues through the PCB 116 to the bracket 190 disposed below the PCB 116.

When the heat generating device 124 is present as shown in phantom in FIG. 10, the bottom side heat transfer path 1002 originates at the heat generating device 124. The bottom side heat transfer path 1002 first transfers heat vertically downward (i.e., in the (−)Y direction) from the heat generating device 124 disposed below the PCB 116 to the bracket 190 disposed below the PCB 116.

Within the bracket 190, the bottom side heat transfer path 1002 splits into a plurality of extra-die branches 1004. The number of extra-die branches 1004 is generally the same as the number of extra-package heat conductors 170 (or aligned pairs of extra-package heat conductors 502, 504) extending between the bracket 190 and cooling plate 182. A first portion of each extra-die branch 1004 extends laterally outward (i.e., in the X-Z plane) within the bracket 190 from the region below the chip package 100 beyond the lateral extents (148 in FIGS. 1-3). A second portion of each extra-die branch 1004 extends vertically upward and outward of the chip package 100, from the bracket 190, through the PCB 116 and extra-package heat conductors 170, to the bottom of the cooling plate 182 of the thermal management device 102. The portion of the extra-die branch 1004 that passes through the extra-package heat conductors 170 has a predominantly vertically orientation.

Within the thermal management device 102, each extra-die branch 1004 of the bottom side heat transfer path 1002 splits into a passive device branch 1006 and a non-passive device branch 1008. Both the passive and non-passive device branches 1006, 1008 of the bottom side heat transfer path 1002 have a predominantly horizontal orientation (i.e., reside in the X-Z plane).

The passive device branch 1006 generally extends from where the bottom side heat transfer path 1002 exits the extra-package heat conductor 170, into the tab 212 of the cooling plate 182, through the passive cooling device 176, and ultimately to the active cooling device 184. The passive device branch 1006 may pass through a portion of the body 210 of the cooling plate 184 between the passive cooling device 176 and the active cooling device 184.

The non-passive device branch 1008 of the extra-die branch 1004 of the bottom side heat transfer path 1002 generally extends from where the bottom side heat transfer path 1002 exits the extra-package heat conductor 170, into the tab 212 of the cooling plate 182, through the tab 212 and body 210 of the cooling plate 182, and ultimately to the active cooling device 184.

Within the extra-die branch 1004, the passive device branch 1006 conducts heat more efficiently than the non-passive device branch 1008. Thus, heat may be predominantly transferred through the bottom side heat transfer path 1002 to the active cooling device 184 through the passive device branch 1006. Transferring heat predominantly through the passive device branch 1006 allows more heat to be transferred through the region of the cooling plate 182 located within the lateral extents 148 of the chip package 100 via the top side heat transfer path 1000. Accordingly, heat transfer through both the top side heat transfer path 1000 and the bottom side heat transfer path 1002 are balanced to enhance the total amount of heat removed from the chip package 100 to the thermal management device 102. Moreover, the efficient removal of heat from the bottom regions of the chip package 100 proximate the PCB 116 by the bottom side heat transfer path 1002 allows great design flexibility in that higher power devices and current capacities may be utilized in the lower regions of the chip package 100 substantially diminished risk of overheating, damage or loss of performance.

Thus, micro devices having enhanced through printed circuit board (PCB) heat transfer are provided. The micro devices utilize extra-package heat paths disposed laterally outward of the chip package to provide at least a portion of a thermally conductive heat transfer path through the PCB. In addition to heat removed from the top of the chip package to a thermal management device, the through PCB, extra-package heat transfer path allows heat to be removed from the bottom of the chip package. The heat removed and collected on the bottom of the PCB is routed to the thermal management device disposed above the chip package without interfering with routings and electrical connections disposed directly below the chip package in the PCB. This is particularly advantageous for thermal management of high power devices that are located close to the PCB, where convention heat transfer out through the top of the chip package is inefficient or inadequate. Thus, the extra-package heat transfer paths enabled by extra-package heat conductors disposed laterally outward of the chip package provide a vertical conductive heat transfer path between the bottom of the PCB and the thermal management device without interfering with the design or performance of the chip package. The additional heat sinking provided by the extra-package heat transfer paths enable higher power usage, improved performance and improved reliability of the chip package, and ultimately better efficiency and performance of the micro devices.

While the foregoing is directed to embodiments of the present invention, other and further embodiments of the invention may be devised without departing from the basic scope thereof, and the scope thereof is determined by the claims that follow.

What is claimed is:

1. A micro device comprising:
   a printed circuit board (PCB);
   a thermal management device;
   a chip package having a first side facing the thermal management device and a second side mounted to a first side of the PCB;
   a bracket on a second side of the PCB that faces away from the chip package; and
   a plurality of extra-package heat conductors disposed laterally outward of the chip package, the plurality of extra-package heat conductors providing at least a portion of a thermally conductive heat transfer path between the bracket and the thermal management device through the PCB.

2. The micro device of claim 1, wherein the thermal management device further comprises at least one or both of:
   an active cooling device having an inlet port, internal channels and an outlet port configured to flow a heat transfer fluid therethrough; and
   a passive cooling device.

3. The micro device of claim 1, wherein the thermal management device further comprises:
   a heat generating device disposed between the bracket and the PCB.

4. The micro device of claim 1, wherein the thermal management device further comprises:
   a plate body disposed directly over the chip package; and
   plate tabs extending from the plate body laterally outward of the chip package, each plate tab aligned with a respective one of the plurality of extra-package heat conductors.

5. The micro device of claim 4 further comprising:
   spring loaded fasteners coupling the plate tabs to the bracket.

6. The micro device of claim 4, wherein at least a first plate tab of the plate tabs further comprises:
   a pocket receiving an end of one of the plurality of extra-package heat conductors.

7. The micro device of claim 1, wherein the bracket further comprises:
   a bracket body disposed directly below the chip package; and
   bracket tabs extending from the bracket body laterally outward of the chip package, each bracket tab aligned with a respective one of the plurality of extra-package heat conductors.

8. The micro device of claim 7, wherein at least a first bracket tab of the bracket tabs further comprises:
   a pocket receiving an end of one of the plurality of extra-package heat conductors.

9. The micro device of claim 1, wherein a first extra-package heat conductor the plurality of extra-package heat conductors further comprises:
   a first end that is surface mounted to the PCB.

10. The micro device of claim 1, wherein a first extra-package heat conductor the plurality of extra-package heat conductors extends through an aperture formed through the PCB.

11. The micro device of claim 1, wherein one end of a first extra-package heat conductor the plurality of extra-package heat conductors is mechanically attached to one of the thermal management device or the bracket.

12. The micro device of claim 1, wherein one end of a first extra-package heat conductor the plurality of extra-package heat conductors has surface features that are interleaved with mating surface features of one of the thermal management device or the bracket.

13. A micro device comprising:
a printed circuit board (PCB);
a chip package mounted to the PCB;
a thermal management device sandwiching the chip package against the PCB, the thermal management device comprising a cooling plate and a least or both of:
an active cooling device disposed on the cooling plate, the active cooling device having an inlet port, internal channels and an outlet port configured to flow a heat transfer fluid therethrough;
one or more passive cooling devices disposed on the cooling plate;
a bracket on a second side of the PCB that faces away from the chip package;
a heat generating device disposed between the bracket and the PCB; and
a plurality of extra-package heat conductors disposed laterally outward of the chip package, the plurality of extra-package heat conductors providing at least a portion of a thermally conductive heat transfer path between the bracket and the thermal management device through the PCB.

14. The micro device of claim 13, wherein the passive cooling device further comprises:
a plate body disposed directly over the chip package; and
plate tabs extending from the plate body laterally outward of the chip package, each plate tab aligned with a respective one of the plurality of extra-package heat conductors and in contact with the one or more passive cooling devices.

15. The micro device of claim 14, wherein at least a first plate tab of the plate tabs further comprises:
a pocket receiving an end of one of the plurality of extra-package heat conductors.

16. The micro device of claim 13, wherein the bracket further comprises:

a bracket body disposed directly below the chip package; and
bracket tabs extending from the bracket body laterally outward of the chip package, each bracket tab aligned with a respective one of the plurality of extra-package heat conductors.

17. The micro device of claim 16, wherein at least a first bracket tab of the bracket tabs further comprises:
a pocket receiving an end of one of the plurality of extra-package heat conductors.

18. The micro device of claim 13, wherein a first extra-package heat conductor the plurality of extra-package heat conductors is last least one or more of surface mounted to the PCB, extending through an aperture formed through the PCB, or mechanically attached to one of the thermal management device or the bracket.

19. A micro device comprising:
a printed circuit board (PCB);
a thermal management device;
a chip package having a first side facing the thermal management device and a second side mounted to a first side of the PCB;
a bracket on a second side of the PCB that faces away from the chip package;
a heat generating device disposed between the bracket and the PCB; and
a first plurality of extra-package heat conductors disposed laterally outward of the chip package and surface mounted to the PCB, the first plurality of extra-package heat conductors providing at least a portion of a thermally conductive heat transfer path between the bracket and the thermal management device through the PCB.

20. The micro device of claim 19 further comprising:
a second plurality of extra-package heat conductors disposed laterally outward of the chip package, the second plurality of extra-package heat conductors contacting at least one of the bracket and the thermal management device, each of the second plurality of extra-package heat conductors respectively aligned across the PCB with a respective one of the first plurality of extra-package heat conductors.

* * * * *